United States Patent
Malonzo

(10) Patent No.: US 8,959,416 B1
(45) Date of Patent: Feb. 17, 2015

(54) MEMORY DEFECT MANAGEMENT USING SIGNATURE IDENTIFICATION

(75) Inventor: Benson B. Malonzo, Aliso Viejo, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 51 days.

(21) Appl. No.: 13/328,863

(22) Filed: Dec. 16, 2011

(51) Int. Cl.
*G11C 29/00* (2006.01)

(52) U.S. Cl.
USPC .......................................... 714/763; 714/752

(58) Field of Classification Search
USPC ............... 714/2, 42, 718, 723, 763, 710, 752; 360/26, 36.1, 47, 53; 365/200, 201
See application file for complete search history.

(56) References Cited

U.S. PATENT DOCUMENTS

| | | | |
|---|---|---|---|
| 5,098,076 A * | 3/1992 | Kelsey ........................ | 270/52.05 |
| 5,200,959 A | 4/1993 | Gross et al. | |
| 5,561,566 A * | 10/1996 | Kigami et al. .................. | 360/48 |
| 5,740,349 A * | 4/1998 | Hasbun et al. ................ | 714/6.13 |
| 6,590,816 B2 * | 7/2003 | Perner ........................... | 365/200 |
| 6,856,556 B1 | 2/2005 | Hajeck | |
| 7,126,857 B2 | 10/2006 | Hajeck | |
| 7,430,136 B2 | 9/2008 | Merry, Jr. et al. | |
| 7,447,807 B1 | 11/2008 | Merry et al. | |
| 7,502,256 B2 | 3/2009 | Merry, Jr. et al. | |
| 7,509,441 B1 | 3/2009 | Merry et al. | |
| 7,596,643 B2 | 9/2009 | Merry, Jr. et al. | |
| 7,653,778 B2 | 1/2010 | Merry, Jr. et al. | |
| 7,685,337 B2 | 3/2010 | Merry, Jr. et al. | |
| 7,685,338 B2 | 3/2010 | Merry, Jr. et al. | |
| 7,685,374 B2 | 3/2010 | Diggs et al. | |
| 7,733,712 B1 | 6/2010 | Walston et al. | |
| 7,765,373 B1 | 7/2010 | Merry et al. | |
| 7,898,855 B2 | 3/2011 | Merry, Jr. et al. | |
| 7,912,991 B1 | 3/2011 | Merry et al. | |
| 7,936,603 B2 | 5/2011 | Merry, Jr. et al. | |
| 7,962,792 B2 | 6/2011 | Diggs et al. | |
| 8,078,918 B2 | 12/2011 | Diggs et al. | |
| 8,090,899 B1 | 1/2012 | Syu | |
| 8,095,851 B2 | 1/2012 | Diggs et al. | |
| 8,108,692 B1 | 1/2012 | Merry et al. | |
| 8,122,185 B2 | 2/2012 | Merry, Jr. et al. | |
| 8,127,048 B1 | 2/2012 | Merry et al. | |

(Continued)

FOREIGN PATENT DOCUMENTS

WO 2009/129340 A2 10/2009

OTHER PUBLICATIONS

Micron Technology, Inc., Technical Note (TN-29-59): Bad Block Management in NAND Flash Memory. www.micron.com/productsupport, downloaded: Dec. 15, 2011.

(Continued)

*Primary Examiner* — Albert Decady
*Assistant Examiner* — Osman Alshack

(57) ABSTRACT

A non-volatile storage subsystem is disclosed that implements a process for reliably managing memory defect information. In one embodiment, a list indicating the locations of defective memory locations is stored in a non-volatile storage device along with a signature that can be used to identify the location of the stored defect list. The stored list may relate to memory defects that are associated with, or developed in connection with, a manufacturing process of the storage device. The signature may be stored in a metadata portion of one or more pages in which the list is stored.

17 Claims, 5 Drawing Sheets

(56) References Cited

U.S. PATENT DOCUMENTS

| | | | |
|---|---|---|---|
| 8,135,903 B1 | 3/2012 | Kan | |
| 8,151,020 B2 | 4/2012 | Merry, Jr. et al. | |
| 8,156,392 B2 * | 4/2012 | Flynn et al. | 714/723 |
| 8,161,227 B1 | 4/2012 | Diggs et al. | |
| 8,166,245 B2 | 4/2012 | Diggs et al. | |
| 8,196,016 B1 * | 6/2012 | Langner et al. | 714/758 |
| 8,243,525 B1 | 8/2012 | Kan | |
| 8,254,172 B1 | 8/2012 | Kan | |
| 8,261,012 B2 | 9/2012 | Kan | |
| 8,296,625 B2 | 10/2012 | Diggs et al. | |
| 8,312,207 B2 | 11/2012 | Merry, Jr. et al. | |
| 8,316,176 B1 | 11/2012 | Phan et al. | |
| 8,341,339 B1 | 12/2012 | Boyle et al. | |
| 8,375,151 B1 | 2/2013 | Kan | |
| 8,392,635 B2 | 3/2013 | Booth et al. | |
| 8,397,107 B1 | 3/2013 | Syu et al. | |
| 8,407,449 B1 | 3/2013 | Colon et al. | |
| 8,423,722 B1 | 4/2013 | Deforest et al. | |
| 8,433,858 B1 | 4/2013 | Diggs et al. | |
| 8,443,167 B1 | 5/2013 | Fallone et al. | |
| 8,447,920 B1 | 5/2013 | Syu | |
| 8,458,435 B1 | 6/2013 | Rainey, III et al. | |
| 8,478,930 B1 | 7/2013 | Syu | |
| 8,489,854 B1 | 7/2013 | Colon et al. | |
| 8,503,237 B1 | 8/2013 | Horn | |
| 8,521,972 B1 | 8/2013 | Boyle et al. | |
| 8,549,236 B2 | 10/2013 | Diggs et al. | |
| 8,583,835 B1 | 11/2013 | Kan | |
| 8,601,311 B2 | 12/2013 | Horn | |
| 8,601,313 B1 | 12/2013 | Horn | |
| 8,612,669 B1 | 12/2013 | Syu et al. | |
| 8,612,804 B1 | 12/2013 | Kang et al. | |
| 8,615,681 B2 | 12/2013 | Horn | |
| 8,638,602 B1 | 1/2014 | Horn | |
| 8,639,872 B1 | 1/2014 | Boyle et al. | |
| 8,683,113 B2 | 3/2014 | Abasto et al. | |
| 8,700,834 B2 | 4/2014 | Horn et al. | |
| 8,700,950 B1 | 4/2014 | Syu | |
| 8,700,951 B1 | 4/2014 | Call et al. | |
| 8,706,985 B1 | 4/2014 | Boyle et al. | |
| 8,707,104 B1 | 4/2014 | Jean | |
| 8,713,066 B1 | 4/2014 | Lo et al. | |
| 8,713,357 B1 | 4/2014 | Jean et al. | |
| 8,719,531 B2 | 5/2014 | Strange et al. | |
| 8,724,422 B1 | 5/2014 | Agness et al. | |
| 8,725,931 B1 | 5/2014 | Kang | |
| 8,745,277 B2 | 6/2014 | Kan | |
| 8,751,728 B1 | 6/2014 | Syu et al. | |
| 8,769,190 B1 | 7/2014 | Syu et al. | |
| 8,769,232 B2 | 7/2014 | Suryabudi et al. | |
| 8,775,720 B1 | 7/2014 | Meyer et al. | |
| 8,782,327 B1 | 7/2014 | Kang et al. | |
| 8,788,778 B1 | 7/2014 | Boyle | |
| 8,788,779 B1 | 7/2014 | Horn | |
| 8,788,880 B1 | 7/2014 | Gosla et al. | |
| 8,793,429 B1 | 7/2014 | Call et al. | |
| 2004/0080998 A1 * | 4/2004 | Chang et al. | 365/200 |
| 2006/0013048 A1 * | 1/2006 | Kim | 365/200 |
| 2006/0031710 A1 * | 2/2006 | Jo | 714/5 |
| 2007/0180186 A1 * | 8/2007 | Cornwell et al. | 711/103 |
| 2007/0180328 A1 * | 8/2007 | Cornwell et al. | 714/42 |
| 2008/0141043 A1 * | 6/2008 | Flynn et al. | 713/193 |
| 2009/0059695 A1 * | 3/2009 | Kim et al. | 365/200 |
| 2009/0172482 A1 * | 7/2009 | Wang et al. | 714/723 |
| 2009/0259806 A1 * | 10/2009 | Kilzer et al. | 711/103 |
| 2009/0265403 A1 * | 10/2009 | Fukumoto | 707/206 |
| 2010/0174849 A1 | 7/2010 | Walston et al. | |
| 2010/0205353 A1 * | 8/2010 | Miyamoto et al. | 711/103 |
| 2010/0250793 A1 | 9/2010 | Syu | |
| 2011/0055458 A1 * | 3/2011 | Kuehne | 711/103 |
| 2011/0099323 A1 | 4/2011 | Syu | |
| 2011/0238900 A1 * | 9/2011 | Heo et al. | 711/103 |
| 2011/0283049 A1 | 11/2011 | Kang et al. | |
| 2012/0260020 A1 | 10/2012 | Suryabudi et al. | |
| 2012/0278531 A1 | 11/2012 | Horn | |
| 2012/0284460 A1 | 11/2012 | Guda | |
| 2012/0324191 A1 | 12/2012 | Strange et al. | |
| 2013/0132638 A1 | 5/2013 | Horn et al. | |
| 2013/0145106 A1 | 6/2013 | Kan | |
| 2013/0290793 A1 | 10/2013 | Booth et al. | |
| 2014/0059405 A1 | 2/2014 | Syu et al. | |
| 2014/0101369 A1 | 4/2014 | Tomlin et al. | |
| 2014/0115427 A1 | 4/2014 | Lu | |
| 2014/0133220 A1 | 5/2014 | Danilak et al. | |
| 2014/0136753 A1 | 5/2014 | Tomlin et al. | |
| 2014/0149826 A1 | 5/2014 | Lu et al. | |
| 2014/0157078 A1 | 6/2014 | Danilak et al. | |
| 2014/0181432 A1 | 6/2014 | Horn | |
| 2014/0223255 A1 | 8/2014 | Lu et al. | |

OTHER PUBLICATIONS

Micron Technology, Inc., Technical Note (TN-29-17): Design and Use Considerations for NAND Flash Memory. www.micron.com/productsupport, downloaded: Dec. 15, 2011.

* cited by examiner

MEMORY DEFECT MANAGEMENT USING SIGNATURE IDENTIFICATION

BACKGROUND

1. Technical Field

This disclosure relates to non-volatile storage devices, including but not limited to solid state drives (SSD). More particularly, the disclosure relates to systems and methods for storing and/or locating memory defect lists in an SSD.

2. Description of the Related Art

Non-volatile storage devices may contain bad blocks of memory. Bad blocks may develop in connection with device manufacturing, or may develop at another point during the lifetime of the device. Bad blocks may comprise one or more memory locations whose reliability is not guaranteed.

Knowledge of the location of bad blocks may be advantageous or necessary for effective operation of the storage device. However, it may be difficult to locate bad blocks reliably and quickly.

BRIEF DESCRIPTION OF THE DRAWINGS

Systems and methods that embody the various features of the invention will now be described with reference to the following drawings, in which.

DETAILED DESCRIPTION OF SPECIFIC EMBODIMENTS

While certain embodiments are described, these embodiments are presented by way of example only, and are not intended to limit the scope of protection. Indeed, the novel methods and systems described herein may be embodied in a variety of other forms. Furthermore, various omissions, substitutions and changes in the form of the methods and systems described herein may be made without departing from the scope of protection.

Overview

Information related to the locations of bad blocks in a non-volatile storage device may be contained in one or more tables stored, for example, in the storage device itself. Such tables are often populated by scanning the storage device to identify blocks that are defective in some way. Storage of information relating to the location of defective blocks may be desirable in order to ensure that such blocks will not be used for data storage.

Although a defective block table may be stored in the non-volatile storage device, the table is not necessarily stored in the same location, from one device to the next. Furthermore, as further defects in the storage device develop, the table may be modified to reflect the new defects. Therefore, it may be difficult to locate or access the originally-stored table of defective blocks. This can cause problems, as it may be desirable to access the originally-stored table for various reasons at some point in time.

In some embodiments of the present invention, a metadata, or spare data, portion of one or more pages of a non-volatile memory device is utilized when a memory defect list is stored on the device in order to identify the location of the list. For example, a signature that identifies the memory defect list may be contained in the metadata portion of one or more pages. Searching for the signature may allow for a reliable, convenient, and quick location of the memory defect list once the list, along with the signature, have been stored. In an embodiment, at least one copy of the memory defect list is maintained in its original state. That is, the location of blocks that only later become defective are not added to the list. In this way, an original manufacturing defect list may be maintained and be accessible.

System Overview

Figure 1:
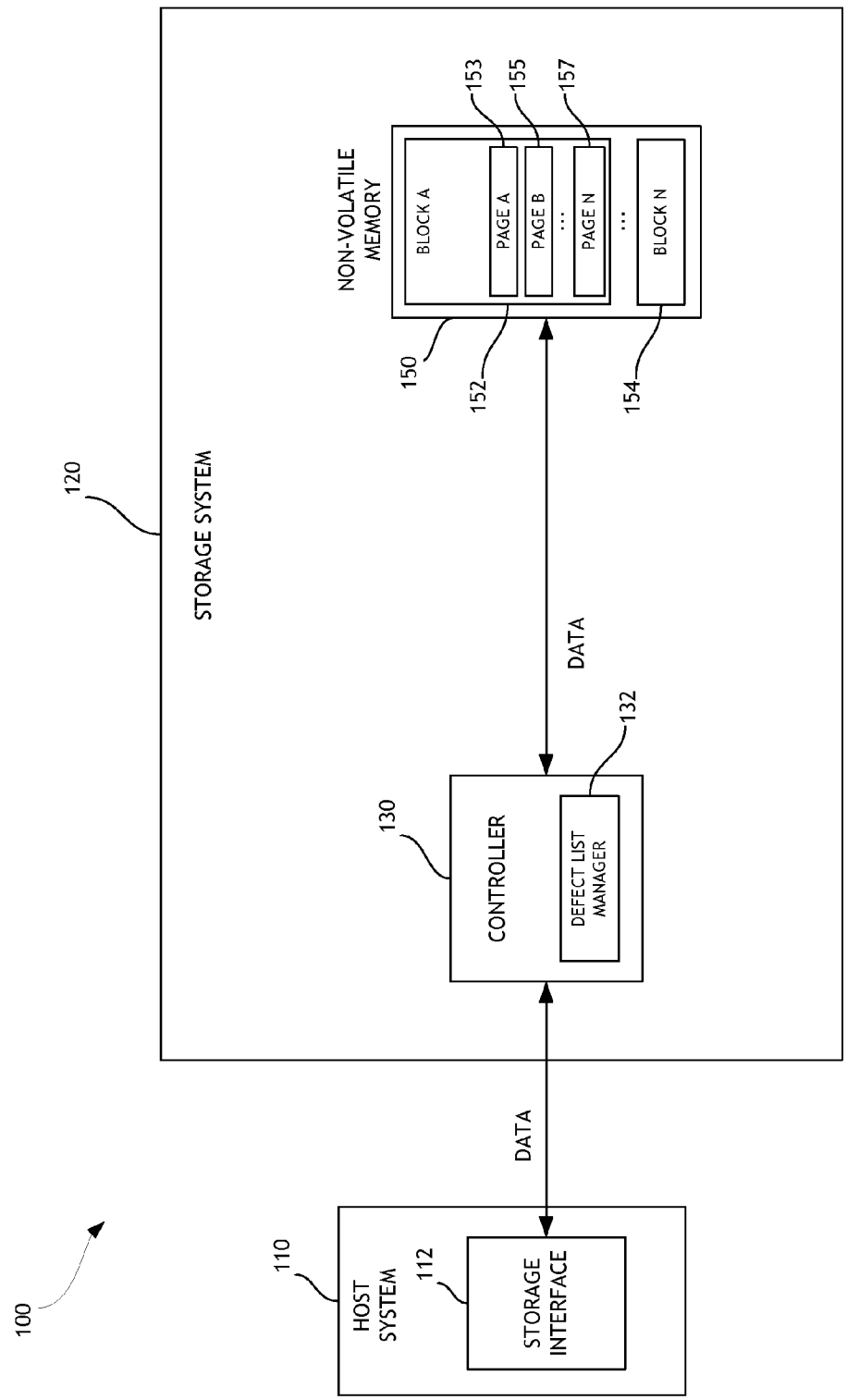
FIG. 1 is a block diagram illustrating a storage system that implements memory defect list management in accordance with one embodiment of the invention.

FIG. 1 illustrates a storage system that implements memory defect list management in accordance with one embodiment of the invention. As shown, a storage system 120 (e.g., a disk drive, such as a hybrid disk drive or solid-state disk drive) includes a controller 130, and a non-volatile storage memory module 150, which comprises a plurality of blocks of storage, identified as Blocks "A" (152) through "N" (154). The term "block" is used herein according to its broad and ordinary meaning, and may include any portion of the non-volatile storage of module 150. Each block may contain a plurality of pages. For example, Block A (152) of FIG. 1 includes a plurality of pages, identified as Pages A (153), B (155), through N (157). The term "page" is used herein according to its broad and ordinary meaning, and may include any portion of a block of storage, as described herein.

The controller 130 can be configured to receive data and/or storage access commands from a storage interface module 112 (e.g., a device driver) in a host system 110. Storage access commands communicated by the storage interface 112 can include write and read commands issued by the host system 110. Read and write commands can specify a logical block address in the storage system. The controller 130 can execute the received commands in the non-volatile memory module 150. The controller 130 may include a defect list manager module 132, which manages the generation, storage, and/or recovery of memory defect information in accordance with one or more embodiments disclosed herein. In one embodiment, the controller can store the memory defect list in memory (e.g., DRAM).

The non-volatile memory module 150 may be implemented using NAND flash memory devices. Other types of solid-state memory devices can alternatively be used, including flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NOR memory, EEPROM, Ferroelectric Memory (FeRAM), or other discrete NVM (non-volatile memory) chips. In one embodiment, the memory devices are preferably MLC devices, although SLC memory devices, or a combination of SLC and MLC devices may be used in some embodiments.

Storage system 120 can store data communicated by the host system 110. That is, the storage system 120 can act as memory storage for the host system 110. To facilitate this function, the controller 130 can implement a logical interface. Logical interface can present to the host system 110 storage system's memory as a set of logical addresses (e.g., contiguous address) where data can be stored. Internally, the controller 130 can map logical addresses to various physical memory addresses in the non-volatile memory module 150.

Figure 2:
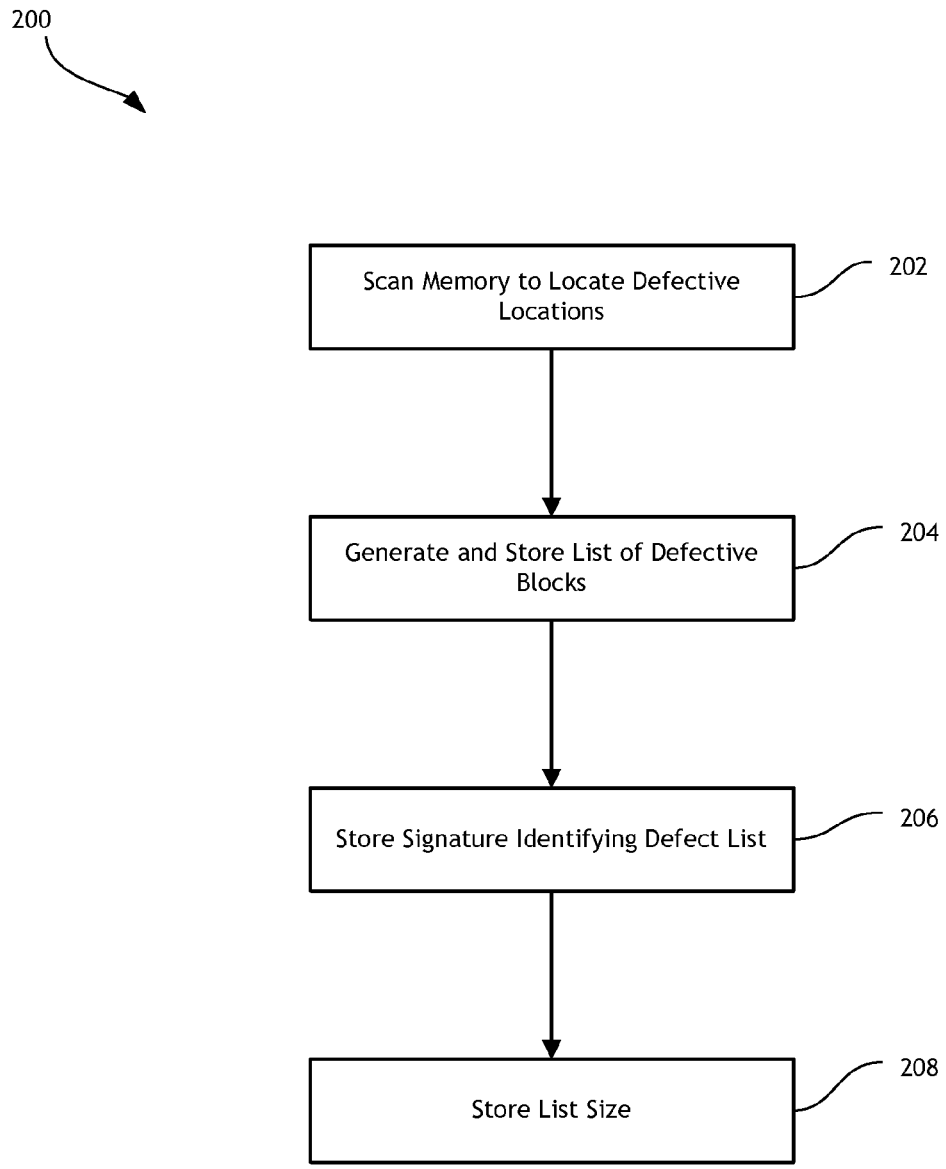
FIG. 2 is a flow diagram illustrating a process for generating and storing a memory defect list in a non-volatile storage device in accordance with one embodiment of the invention.

FIG. 2 is a flow diagram illustrating a process 200 for generating and storing a memory defect list in a non-volatile storage device in accordance with one embodiment of the invention. In one embodiment, the process 200 can be executed by the controller 130 and/or the defect list manager module 132. In one embodiment, a non-volatile storage device (e.g., 150) is scanned to find bad/defective blocks, as shown at step 202. In an embodiment, the defective blocks may have developed during manufacturing of the device and are identified by the absence or presence of a predetermined value in some portion of the blocks. For example, a device may be received from a manufacturer in which all, or some, of the locations within the valid blocks have been erased or otherwise suitably marked. Erased locations within a valid block may contain a value that identifies them as such, such as a value equal to "FFh." In such an embodiment, by searching for blocks that do not contain this or other known value in one or more predetermined locations within the block, it may be possible to identify invalid, or defective blocks.

Once defective blocks have been located at step 202, a list may be generated and stored, at step 204, containing information identifying the locations of the defective blocks. In an embodiment, the defect list is stored in the non-volatile storage device. However, the list may be stored in any suitable location, component, or device. A signature identifying the defect list is stored in one or more pages that contain the defect list, or a portion thereof, at step 206. The signature may be a value that uniquely identifies the defect list, or may be any other suitable identifier. In an embodiment, the signature is stored in the metadata portion of one or more pages.

In addition to the signature, one or more other parameters or values associated with the defect list may be stored. For example, a value indicating the size of the memory defect list may be stored in the metadata portion of one or more pages, along with the signature. This occurs at step 208. Such information may be helpful in ascertaining how many pages the defect list spans.

Figure 3:
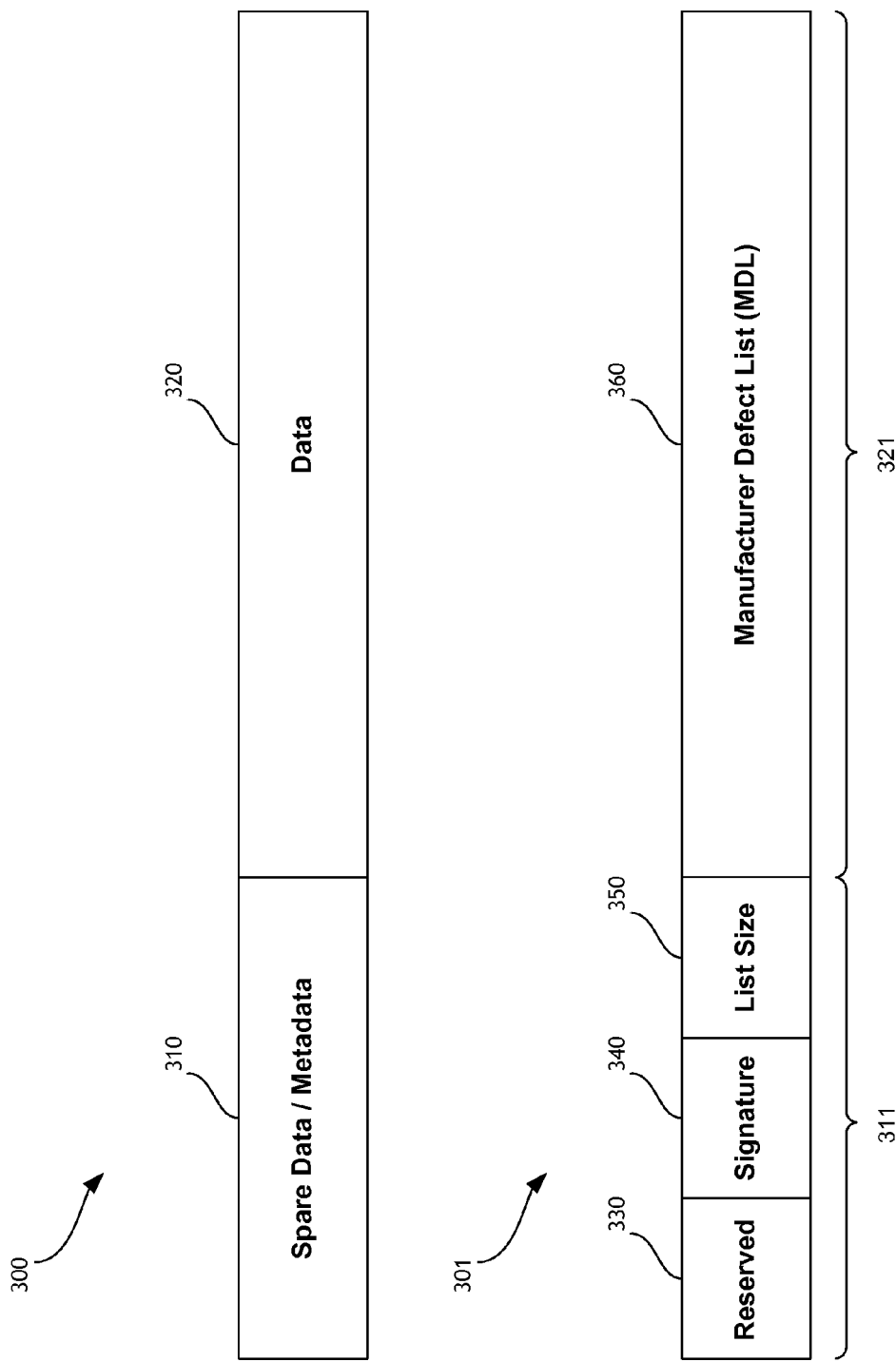
FIG. 3 illustrates an embodiment of a memory defect list stored in a non-volatile storage device.

FIG. 3 illustrates an embodiment of a memory defect list storage configuration in a non-volatile storage device. In an embodiment, a non-volatile storage device includes a plurality of pages, such as page 300 shown in FIG. 3, which include a metadata, or spare data, portion 310 and a data portion 320. The page may be of any suitable size. For example, pages in accordance with embodiments disclosed herein may be 4 KB, 8 KB, or any other size. The page 300 may be a NAND page, or any other type of persistent memory. In an embodiment, a single page of storage includes more than one metadata portion 310 and/or data portion 320. The metadata portion 311 of page 301 includes information associated with a memory defect list containing the locations of manufacturing defects, referred to in FIG. 3 as the Manufacturer Defect List ("MDL") 360. Metadata portion 311 contains a signature 340 that indicates that at least a portion of the defect list 360 is stored in the page in which the signature is located, i.e., page 301. In an embodiment, when a defect list spans multiple pages, the signature 340 may be stored in each of the pages in which at least a portion of the list is stored. Metadata portion 311 further includes a value indicating the size of the defect list. Portion 330 of page 301 represents additional spare memory, in which further information may be stored, or alternatively, portion 330 may be left unutilized.

At least a portion of the defect list 360 is stored in the data portion 321 of page 301. Data portion 321 may entirely contain the defect list 360, or may contain only a portion thereof. The defect list 360 may contain physical addresses, or locations, of blocks that have become defective in some way, such as during manufacturing of the storage device in which it is stored.

Figure 4:
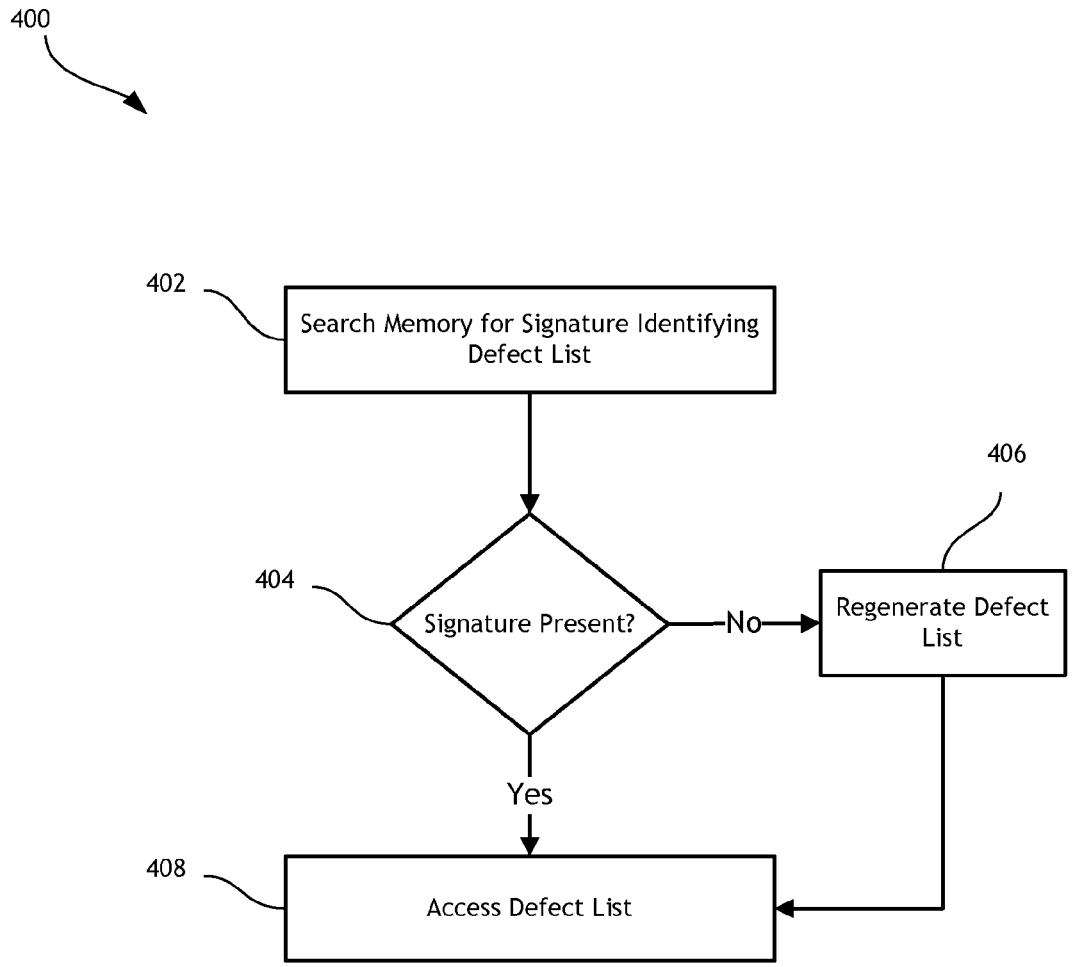
FIG. 4 is a flow diagram illustrating a process for locating a memory defect list in a non-volatile storage device in accordance with one embodiment of the invention.

FIG. 4 is a flow diagram illustrating a process 400 for locating a memory defect list in a non-volatile storage device. In one embodiment, the process 400 can be executed by the controller 130 and/or the defect list manager module 132. At step 402, a search is performed of at least a portion of a non-volatile storage device for a signature that indicates the location of a memory defect list. If one or more instances of the signature are present in the portion of the storage device searched, the location of the defect list is known and may be accessed at step 408. If it is determined, at step 404, that the portion of the storage device searched does not contain the signature, such as in a case where a relevant portion of one or more pages in which the defect list was originally stored has become corrupted, then a defect list is regenerated at step 406. Regeneration of the defect list may comprise scanning the storage device to locate defective blocks of memory, and storing information identifying the locations of such defective blocks in a table. The table may be stored in the storage device, along with a signature indicating the location of the defect list. The signature may be the same signature that was searched for at step 402.

Figure 5:
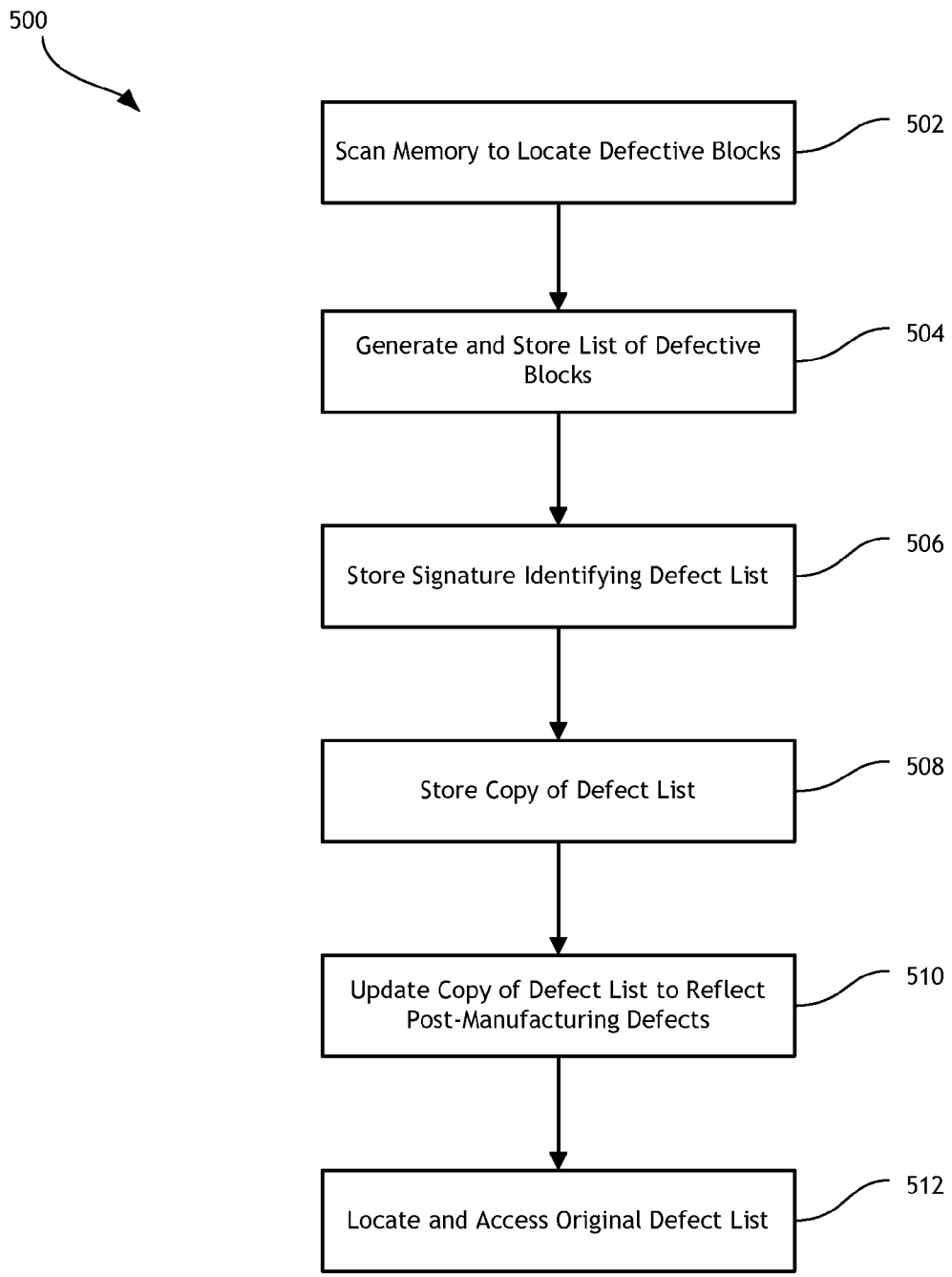
FIG. 5 is a flow diagram illustrating a process for managing a memory defect list in a non-volatile storage device in accordance with one embodiment of the invention.

FIG. 5 is a flow diagram illustrating a process 500 for managing a memory defect list in a non-volatile storage device. In one embodiment, the process 400 can be executed by the controller 130 and/or the defect list manager module 132. In one embodiment, the process 500 may be performed with an initial processing of a non-volatile storage device after blocks of memory that became defective during a manufacturing process have been labeled, or identified, as such. Step 502 involves scanning the storage device to locate such labeled, or identified, manufacturing defects. A defect list is generated and stored at step 504. The defect list includes information indicating the locations of the located defective blocks. The list may be stored, for example, in one or more pages of memory located in the storage device. Although not limiting in any sense, this list may be referred to as, for example, a "P-list," which is a list of original manufacturing defects in the storage device. For convenience, this list will be referred to below as the "P-list" in reference to the process 500 of FIG. 5. A signature is stored at step 506 in at least one page in which the P-list is stored. The signature is a value that indicates the location of the P-list, and may be stored in a metadata portion of one or more pages. The signature is stored to aid in later location of the P-list.

At least one additional copy of the P-list is stored at step 508. In an embodiment, no additional copies of the P-list are stored, and step 508 is bypassed. At least one copy of the P-list may be further updated or modified as additional defects develop. A copy of the P-list that is updated or modified, such that it is not identical, or substantially identical to the originally stored P-list, may be referred to as, for example, a "G-list." Use of this term herein in connection with FIG. 5 is not limiting in any way, and any list discussed herein may be referred to in any suitable or desired manner. The G-list may provide current information relating to the locations of defective blocks of memory, whether those blocks became defective during manufacturing, or at some other point during the life of the storage device. Although the G-list may be modified, such that it is no longer identical or substantially identical to the originally stored P-list, an original copy of the P-list is maintained, and identifiable by the signature stored at step 506. Therefore, at step 512, the original P-list may be located and accessed. Such access may be desirable for various reasons. For example, access to an original manufacturing defect list may be desirable in connection with data reconstruction after corruption of one or more tables, or memory locations, within a non-volatile storage device. In addition, it may be desirable to access an original manufacturing defect list for purposes of resetting, or re-processing a drive.

CONCLUSION

In some embodiments, information related to the location of bad, or defective, blocks in a non-volatile storage device is contained in one or more tables. A defective blocks list may be generated and stored in one or more pages of memory along with a signature that indicates the location of the table. The signature may provide a means for later locating the defect list. The defect list may contain the locations of defective blocks of memory that became defective in connection with a manufacturing process of the storage device. The signature may be located in a metadata portion of the one or more pages that contain at least a portion of the defect list in a data portion of the page. Furthermore, additional information related to the defect list may be stored in the metadata portion.

OTHER VARIATIONS

As used in this application, "non-volatile memory" typically refers to solid-state memory such as, but not limited to, NAND flash. However, the systems and methods of this disclosure may also be useful in more conventional hard drives and hybrid hard drives including both solid-state and hard drive components. The solid-state storage devices (e.g., dies) may be physically divided into planes, blocks, pages, and sectors, as is known in the art. Other forms of storage (e.g., battery backed-up volatile DRAM or SRAM devices, magnetic disk drives, etc.) may additionally or alternatively be used.

Those skilled in the art will appreciate that in some embodiments, other types of memory defect management can be implemented. In addition, the actual steps taken in the processes shown in FIGS. 2, 4, and 5 may differ from those shown in the figures. Depending on the embodiment, certain of the steps described above may be removed, others may be added. Accordingly, the scope of the present disclosure is intended to be defined only by reference to the appended claims.

While certain embodiments have been described, these embodiments have been presented by way of example only, and are not intended to limit the scope of protection. Indeed, the novel methods and systems described herein may be embodied in a variety of other forms. Furthermore, various omissions, substitutions and changes in the form of the methods and systems described herein may be made. The accompanying claims and their equivalents are intended to cover such forms or modifications as would fall within the scope and spirit of the protection. For example, the various components illustrated in the figures may be implemented as software and/or firmware on a processor, ASIC/FPGA, or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. In a solid-state drive system comprising a non-volatile storage medium comprising a plurality of blocks, each block comprising a plurality of pages having a metadata portion and a data portion, a method of maintaining memory defect information on a non-volatile storage medium, the method comprising:
    locating defective blocks on the non-volatile storage medium;
    storing at least a first portion of a list of the defective blocks in the data portion of a first page, the list of defective blocks comprising at least some of located defective blocks; and
    storing a signature comprising an identifier in the metadata portion of the first page, wherein the signature identifies the first page as a page that contains the first portion of the list of defective blocks.

2. The method of claim 1, further comprising searching the non-volatile storage medium for the signature and generating a replacement list of defective blocks when the signature is not found.

3. The method of claim 1, further comprising storing a value that corresponds to the size of the list of defective blocks in the metadata portion of the first page.

4. The method of claim 1, further comprising storing a second portion of the list of defective blocks in the data portion of a second page.

5. The method of claim 4, further comprising storing the signature in the metadata portion of the second page.

6. The method of claim 1, wherein the signature comprises a predetermined value associated with the list of defective blocks.

7. The method of claim 1, wherein locating defective blocks comprises identifying a value in one or more of the plurality of pages that indicates that a block in which the one or more of the plurality of pages is located is defective.

8. The method of claim 7, wherein the value was initially stored by a manufacturer of the non-volatile storage medium.

9. The method of claim 1, wherein the list of defective blocks comprises a list of addresses corresponding to physical locations of the defective blocks.

10. The method of claim 1, further comprising erasing a set of blocks of the non-volatile storage medium that are not identified as defective.

11. The method of claim 1, further comprising updating the list of defective blocks in response to detection of a defective block of memory to reflect the defective block of memory, wherein the defective block of memory became defective after the list of defective blocks has been stored.

12. A solid-state drive comprising:
    a non-volatile storage medium comprising a plurality of pages having a metadata portion and a data portion; and
    a controller configured to:
        scan the non-volatile storage medium for a page that comprises a signature that indicates that the page includes at least a portion of a memory defects list;
        access the memory defects list when the signature is identified; and
        when the signature is not identified:
        locate defective blocks on the non-volatile storage medium;
        store a list of the defective blocks in the data portion of at least one page; and
        store a signature comprising an identifier that identifies the list of defective blocks in the metadata portion of at least one page.

13. The solid-state drive of claim 12, wherein the controller is configured to scan the non-volatile storage medium in response to receiving a request from a host system.

14. The solid-state drive of claim 13, wherein the request comprises a vendor specific command not included in a command set of a storage interface between the host system and the non-volatile storage medium.

15. In a solid-state drive system comprising a non-volatile storage medium comprising a plurality of blocks, each block comprising a plurality of pages having a metadata portion and a data portion, a method of maintaining memory defect information on a non-volatile storage medium, the method comprising:

locating defective blocks on the non-volatile storage medium;

storing at least a first portion of a list of the defective blocks in the data portion of a first page, the list of defective blocks comprising at least some of located defective blocks; and storing a signature in the metadata portion of the first page, wherein the signature identifies the first page as a page that contains the first portion of the list of defective blocks; and updating the list of defective blocks in response to detection of a defective block of memory to reflect the defective block of memory, wherein the defective block of memory became defective after the list of defective blocks has been stored, and wherein a copy of the list of defective blocks is not updated thereby maintaining an initial list of defective blocks.

16. The method of claim 15, wherein the signature comprises an identifier.

17. The method of claim 15, wherein the initial list of defective blocks comprises a manufacturer list of bad blocks identified during manufacture of the solid-state drive system.

* * * * *